US012795989B2

(12) United States Patent
Liu

(10) Patent No.: US 12,795,989 B2
(45) Date of Patent: Nov. 10, 2026

(54) TRENCH MOSFET AND MANUFACTURING METHOD THEREOF

(71) Applicant: SILICON-MAGIC SEMICONDUCTOR TECHNOLOGY (HANGZHOU) CO., LTD., Hangzhou City (CN)

(72) Inventor: Jian Liu, Torrance, CA (US)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 366 days.

(21) Appl. No.: 18/542,278

(22) Filed: Dec. 15, 2023

(65) Prior Publication Data

US 2025/0048673 A1 Feb. 6, 2025

(30) Foreign Application Priority Data

Aug. 4, 2023 (CN) ......................... 202310979907.6

(51) Int. Cl.
*H10D 30/66* (2025.01)
*H10D 30/01* (2025.01)
*H10D 64/27* (2025.01)

(52) U.S. Cl.
CPC ....... *H10D 30/668* (2025.01); *H10D 30/0291* (2025.01); *H10D 64/514* (2025.01); *H10D 64/517* (2025.01)

(58) Field of Classification Search
CPC ...... H10D 8/605; H10D 8/00; H10D 64/2527; H10D 30/0297; H10D 30/668; H10D 64/256; H10D 30/63; H10D 62/114
See application file for complete search history.

(56) References Cited

U.S. PATENT DOCUMENTS

| | | | | |
|---|---|---|---|---|
| 2011/0284953 | A1* | 11/2011 | Long | H10D 8/00 257/E21.409 |
| 2012/0043602 | A1* | 2/2012 | Zeng | H10D 30/668 257/329 |
| 2017/0373180 | A1* | 12/2017 | Haeberlen | H10D 30/668 |

* cited by examiner

*Primary Examiner* — Alia Sabur
(74) *Attorney, Agent, or Firm* — Osha Bergman Watanabe & Burton LLP

(57) ABSTRACT

A trench MOSFET includes: a substrate having a first doping type; an epitaxial layer having the first doping type, located on the substrate; gate trenches and a first conductive channel; gate conductors, each located in one of the gate trenches and isolated from the epitaxial layer via a gate dielectric layer; an epitaxial depletion region having a second doping type, located in the epitaxial layer at a bottom of the first conductive channel; body regions having the second doping type, located on two sides of each gate trench and adjacent to a side wall of the first conductive channel; source regions having the first doping type, each located in each of the body regions; a source electrode, contacting the epitaxial depletion region via the first conductive channel; and a drain electrode, contacting the substrate on a surface of the substrate away from the epitaxial layer.

10 Claims, 7 Drawing Sheets

TRENCH MOSFET AND MANUFACTURING METHOD THEREOF

TECHNICAL FIELD

The present disclosure relates to the technical field of semiconductors, and in particular, to a trench MOSFET and a manufacturing method thereof.

BACKGROUND

For MOSFET (Metal Oxide Semiconductor Field Effect Transistor) devices, a common method to improve functional characteristics is to reduce the device size to increase the cell density of the device, thereby reducing on-resistance. In general, the device of the three-dimensional trench structure uses a separate gate trench and source trench. For medium and high-voltage devices, in order to achieve a specific voltage, the gate trench size is affected by the limitation of the voltage platform.

SUMMARY

The present application provides a trench semiconductor power device and layout thereof to increase cell density of the device.

According to one or more embodiments of the present disclosure, a trench MOSFET, comprising: a substrate having a first doping type; an epitaxial layer having the first doping type, located on the substrate; gate trenches and a first conductive channel, extending from a surface to an inside of the epitaxial layer, the gate trenches being located on two sides of the first conductive channel and symmetrically distributed with respect to the first conductive channel; gate conductors, each located in one of the gate trenches and isolated from the epitaxial layer via a gate dielectric layer; an epitaxial depletion region having a second doping type, located in the epitaxial layer at a bottom of the first conductive channel; body regions having the second doping type, located on two sides of each gate trench and adjacent to a side wall of the first conductive channel; source regions having the first doping type, each located in each of the body regions; a source electrode, contacting the epitaxial depletion region via the first conductive channel; and a drain electrode, contacting the substrate on the surface of the substrate away from the epitaxial layer.

According to one or more embodiments of the present disclosure, a method for manufacturing a trench MOSFET, comprising: forming an epitaxial layer having a first doping type on a substrate having the first doping type; forming gate trenches extending from a surface to an inside of the epitaxial layer; forming a gate conductor and a gate dielectric layer inside each of the gate trenches, the gate conductor being isolated from the epitaxial layer via the gate dielectric layer; forming body regions having a second doping type, the body regions being located on two sides of each gate trench; forming source regions having the first doping type, each of the source regions being located in each of the body regions; forming a first conductive channel extending from the surface to the inside of the epitaxial layer between the two gate trenches, the gate trenches being symmetrically distributed with respect to the first conductive channel; forming an epitaxial depletion region having the second doping type, the epitaxial depletion region being located in the epitaxial layer at a bottom of the first conductive channel; forming a source electrode, the source electrode contacting the epitaxial depletion region via the first conductive channel; and forming a drain electrode, the drain electrode contacting the substrate on the surface of the substrate away from the epitaxial layer.

BRIEF DESCRIPTION OF THE DRAWINGS

The above and other objects, features and advantages of the present disclosure will become clearer through the following description of the embodiments of the present application with reference to the accompanying drawings.

DETAILED DESCRIPTION

Figure 1:
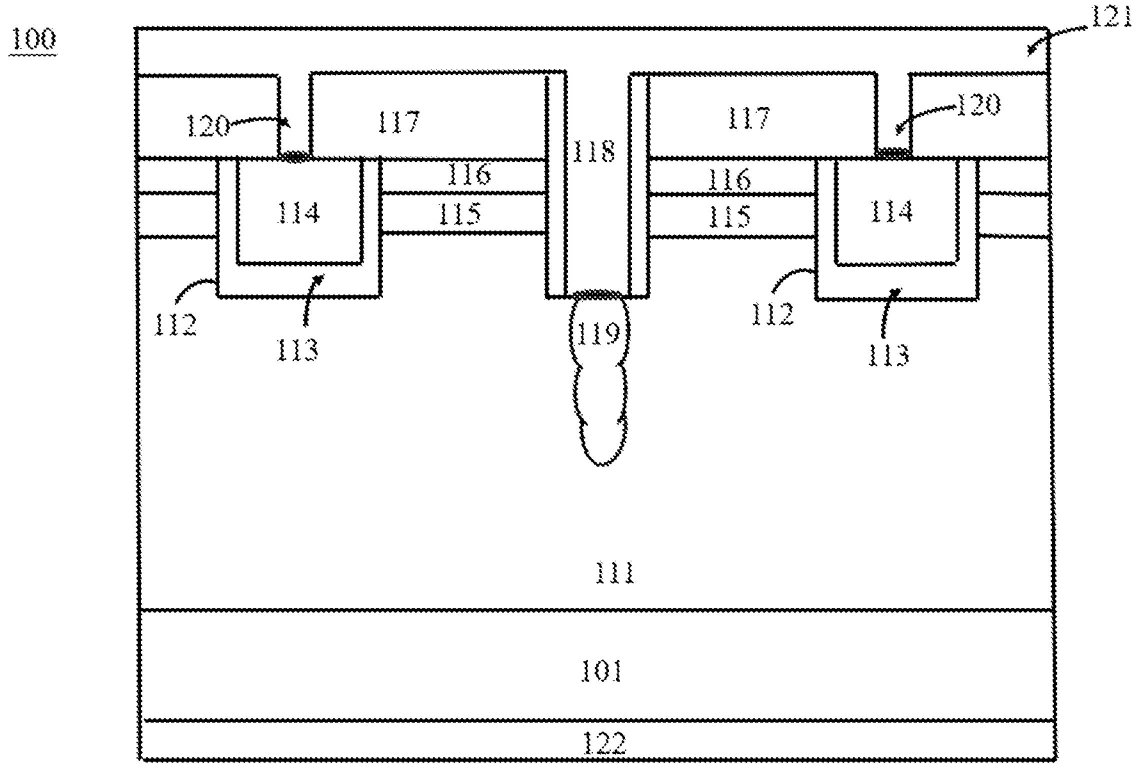
FIG. 1 shows a schematic diagram of a cross-sectional view of a trench MOSFET according to one or more embodiments of the present disclosure.

The present disclosure will be described in more detail below with reference to the accompanying drawings. In each accompanying drawing, the same elements are denoted by the similar reference numerals. For the sake of clarity, each part in the accompanying drawings is not drawn to scale. In addition, some well-known parts may not be shown. For the sake of simplicity, a semiconductor structure obtained after several steps may be described in a drawing.

It should be understood that, during the description of the structure of a device, when a layer or region is referred to as being located "on" or "above" another layer or region, it may be directly located on another layer or region, or other layers or regions are also included between it and another layer or region. Moreover, if the device is turned over, the layer or region will be located "under" or "below" another layer or region.

In order to describe the situation of being directly located on another layer or region, the expression "directly on . . . " or "on and adjacent to . . . " will be adopted herein.

Unless otherwise specified below, various parts of the semiconductor device may be composed of materials known to those skilled in the art. Semiconductor materials include, for example, III-V semiconductors, such as gallium arsenide (GaAs), gallium nitride (GaN), etc., IV-IV semiconductors, such as silicon carbide (SiC), etc., II-VI compound semiconductors, such as cadmium sulfide (CdS), cadmium telluride (CdTe), etc., and Group IV semiconductors, such as silicon (Si), germanium (Ge), etc. The gate conductor can be formed of various materials capable of conducting electricity, such as a metal layer, a doped polysilicon layer, or a stacked gate conductor including a metal layer and a doped polysilicon layer, or other conductive materials, such as TaC, TiN, TaSiN, HfSiN, TiSiN, TiCN, TaAlC, TiAlN, TaN, $PtSi_x$, $Ni_3Si$, Pt, Ru, W, and combinations of various conductive materials. The gate dielectric may be made of $SiO_2$ or a material with a dielectric constant greater than $SiO_2$, including oxides, nitrides, oxynitrides, silicates, aluminates, and titanates, for example. Also, the gate dielectric may not only be formed of materials known to those skilled in the art, but also materials for gate dielectrics developed in the future may be used.

FIG. 1 is a cross-sectional view of a trench MOSFET according to one or more embodiments of the present disclosure. In the present disclosure, the first doping type is one of N-type and P-type, and the second doping type is the other one of N-type and P-type. An N-type semiconductor layer can be formed by implanting N-type dopants, such as P and As, into an intrinsic semiconductor layer. A P-type semiconductor layer can be formed by doping a P-type dopant, such as B, into the semiconductor layer.

As shown in FIG. 1, a trench MOSFET 100 includes a substrate 101 and an epitaxial layer 111 located on a first surface of the substrate 101. The substrate 101 serves as a drain region of a device, and the epitaxial layer 111 serves as a drift region of the device. The substrate 101 and the epitaxial layer have a first doping type. In one or more embodiments, the substrate 101 is N-type heavily doped, and the epitaxial layer 111 is N-type lightly doped.

The trench MOSFET 100 includes gate trenches 112, a gate dielectric layer 113, gate conductors 114, body regions 115, source regions 116, an interlayer dielectric layer 117, a first conductive channel 118, an epitaxial depletion region 119, second conductive channels 120, a source electrode 121 and a drain electrode 122.

The gate trenches 112 and the first conductive channel 118 extend from a surface to an inside of the epitaxial layer 111. The gate trenches 112 are located on two sides of the first conductive channel 118 and symmetrically distributed with respect to the first conductive channel 118.

Each of the gate conductors 114 is located in the gate trench 112 and isolated from the epitaxial layer 111 via a gate dielectric layer 113.

The epitaxial depletion region 119 having a second doping type is located in the epitaxial layer at a bottom of the first conductive channel 118. In one or more embodiments, the epitaxial depletion region 119 is formed by carrying out multiple P-type heavily doped ion implantations to the epitaxial layer via the first conductive channel 118.

The body regions 115 having the second doping type are located on two sides of the gate trench 112 and adjacent to a side wall of the first conductive channel 118. Each of the source regions 116 having the first doping type is located in each of the body regions 115.

The source electrode 121 contacts the epitaxial depletion region 119 via the first conductive channel 118 and contacts the gate conductor 114 via the second conductive channel 120. The drain electrode 122 contacts the substrate 101 on the surface of the substrate 101 away from the epitaxial layer.

In one or more embodiments, a thickness of the gate dielectric layer at a bottom of the gate trench 112 is not smaller than a thickness of the gate dielectric layer on the side wall of the gate trench 112.

In this disclosure, the epitaxial depletion region is formed by multiple ion implantations through an implantation hole, thereby realizing depletion of the drift region of the three-dimensional trench device. Since the implantation hole for the multiple ion implantations can be designed to be very small, the size of the power device can be further reduced, and the cell density of transistors can be increased while minimizing the on-resistance. Especially in medium and high voltage devices, further thickening of the dielectric layer in the source trench will limit the device size and lead to wafer curling. This application does not use the source trench structure typically used for the three-dimensional trench device structure, thereby avoiding these limitations of the voltage platform.

FIG. 2A to FIG. 2L show cross-sectional views of each step of a manufacturing method of a trench MOSFET device according to one or more embodiments of the present disclosure.

Figure 2A:
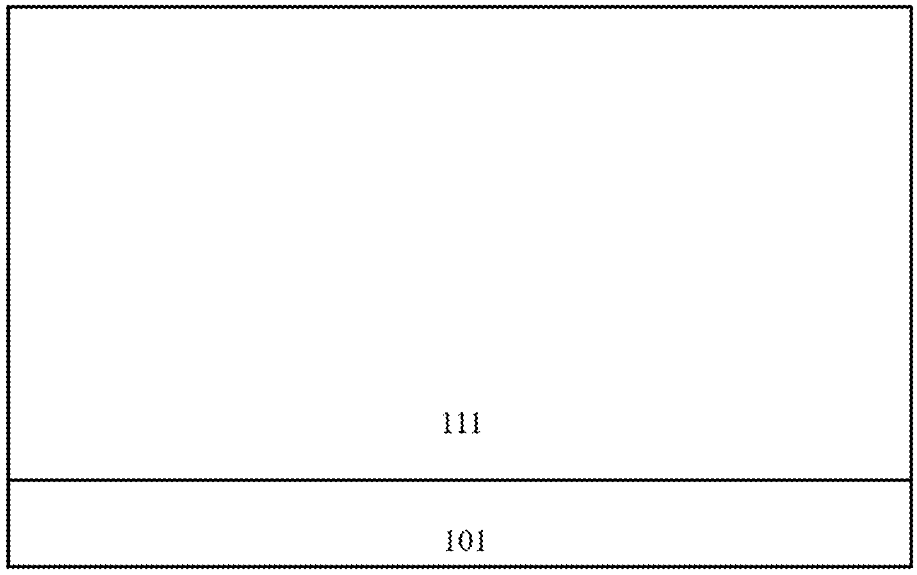
FIG. 2A-2L show schematic diagrams of cross-sectional views of each step of a manufacturing method of the trench MOSFET device according to one or more embodiments of the present disclosure.

As shown in FIG. 2A, an epitaxial layer 111 is formed on a substrate 101.

In this step, the epitaxial layer 111 is formed on the semiconductor substrate 101 by an epitaxial layer growth process. The substrate 101 and the epitaxial layer 111 have the first doping type. The substrate 101 serves as a drain region of a device, and the epitaxial layer 111 serves as a drift region of the device. In one or more embodiments, the substrate 101 is N-type heavily doped, and the epitaxial layer 111 is N-type lightly doped. The substrate 101 may be a silicon carbide (SiC) substrate or a silicon (Si) substrate.

Figure 2B:
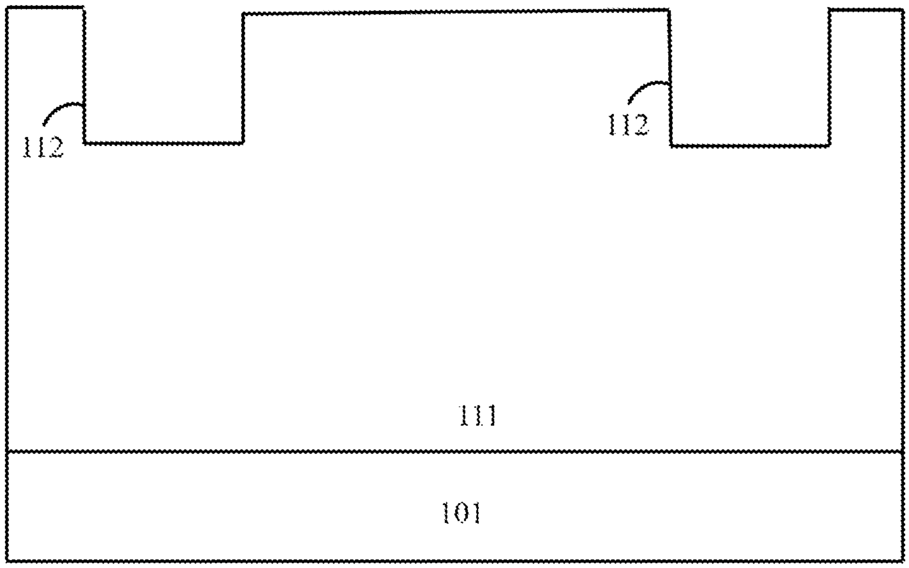

As shown in FIG. 2B, gate trenches 112 are formed.

For example, a mask is formed. A patterned mask is formed by photolithography, and then the epitaxial layer 111 which is not covered by the mask is etched to form the gate trenches 112 in the epitaxial layer 111. In one or more embodiments, the etching may be dry etching, for example, ion milling, plasma etching, reactive ion etching and laser ablation. In one or more embodiments, the mask may be a photoresist mask, and the mask is removed after the gate trenches 112 are formed.

Figure 2C:
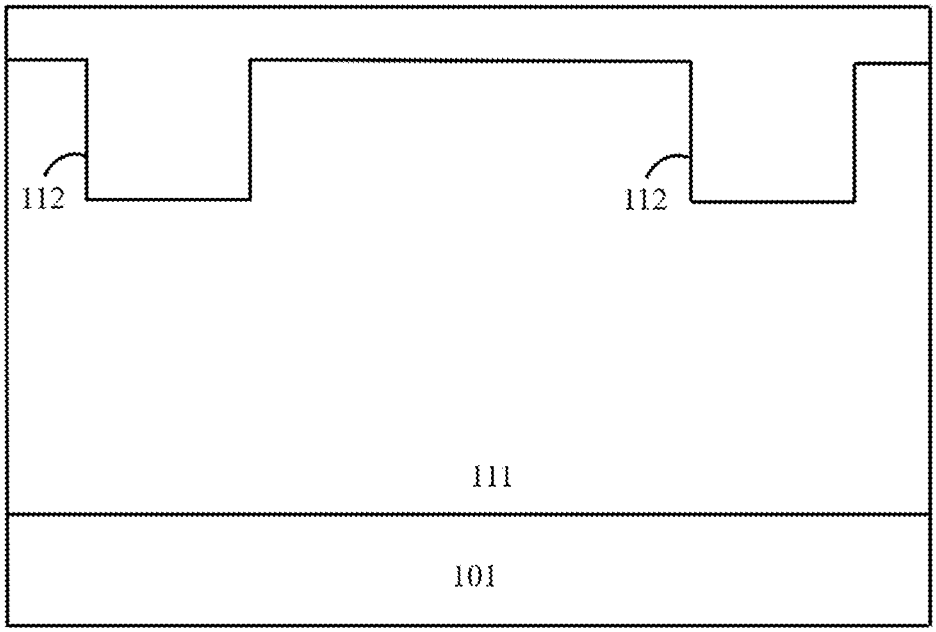
Figure 2D:
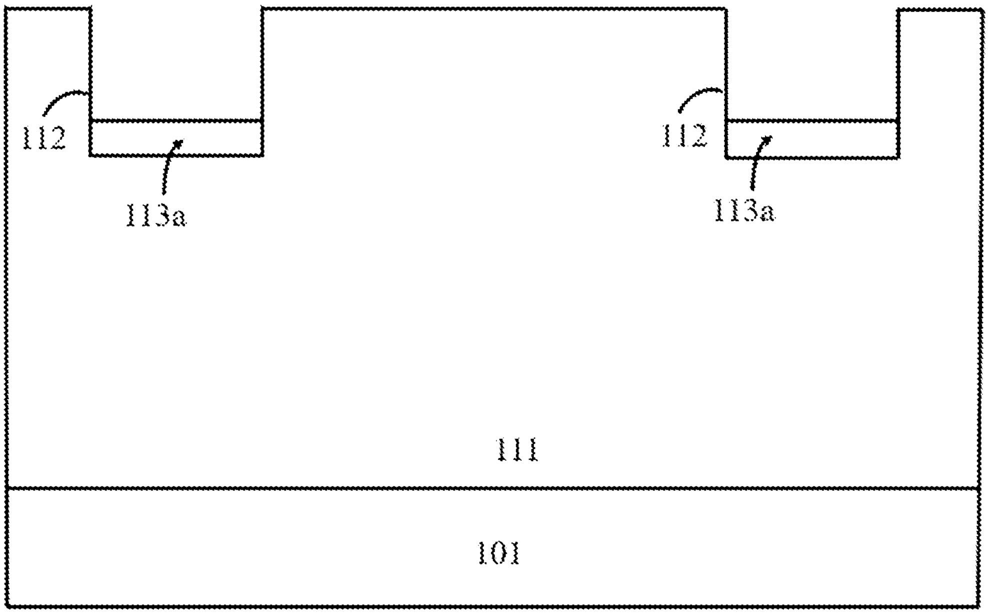
Figure 2E:
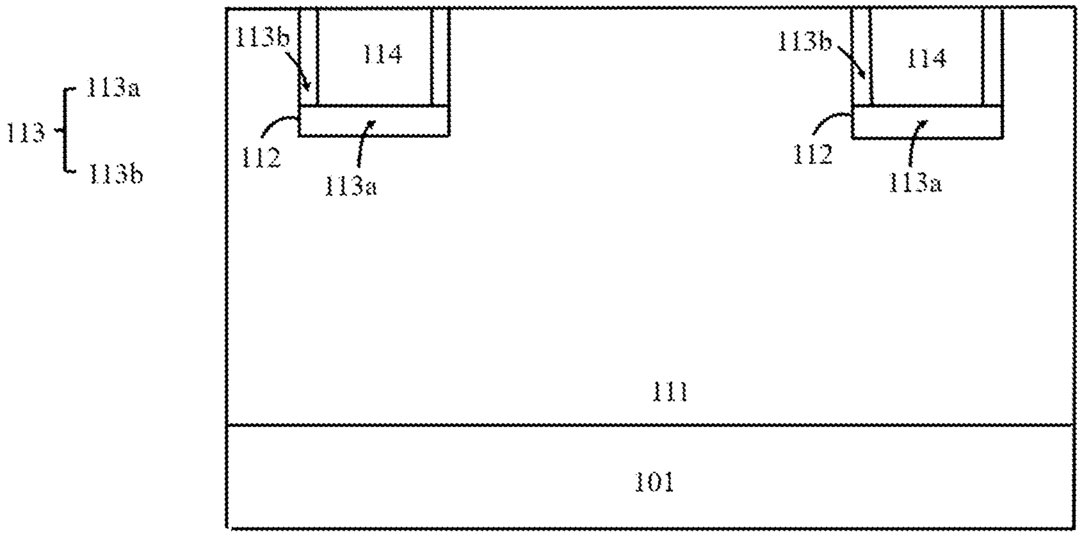

As shown in FIG. 2C to FIG. 2E, a gate conductor 114 and a gate dielectric layer 113 are formed in the gate trench 112. The gate conductor 114 is isolated from the epitaxial layer 111 via the gate dielectric layer 113.

As shown in FIG. 2C, the dielectric layer is formed in the gate trench 112, for example, by deposition. The dielectric layer is located inside the gate trench 112 and on an upper surface of the epitaxial layer 111. The dielectric layer is, for example, a silicon oxide layer.

Next, a portion of the dielectric layer above the epitaxial layer 111 is removed, for example, by etch back or chemical mechanical planarization, so that an upper end of the dielectric layer terminates at the opening of the gate trench 112.

Next, the dielectric layer in the gate trench 112 is etched. A portion of the dielectric layer in the gate trench 112 is etched off to form a gate dielectric layer 113*a* at a bottom of the gate trench (as shown in FIG. 2D).

As shown in FIG. 2E, an oxide layer is grown on a surface of the epitaxial layer 111 and a side wall of the gate trench 112, and the oxide layer on the surface of the epitaxial layer 111 is removed by chemical mechanical polishing so as to form a gate dielectric layer 113*b* on the side wall of the gate trench 112. The gate dielectric layer 113 includes the gate dielectric layer 113*a* at the bottom of the gate trench and the gate dielectric layer 113*b* on the side wall of the gate trench, and a thickness of the gate dielectric layer 113*a* is not smaller than a thickness of the gate dielectric layer 113*b*.

Next, gate conductors 114 are formed. In this step, a conductor layer is formed inside the gate trench 112 and above the epitaxial layer 111, for example, by low-pressure chemical vapor deposition. A portion of the conductor layer above the epitaxial layer 111 is removed by etching back or chemical mechanical planarization to form the gate conductor 114.

Figure 2F:
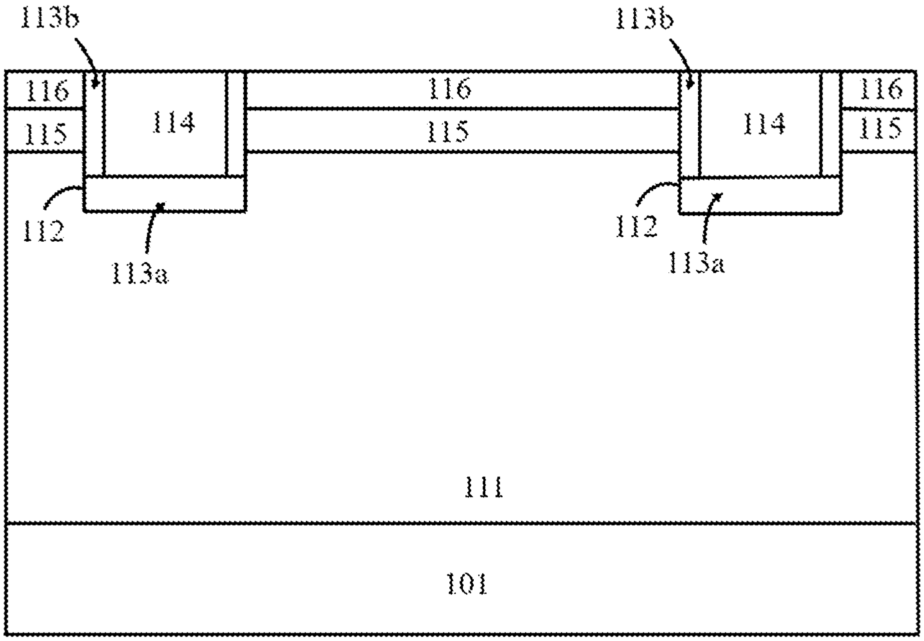

As shown in FIG. 2F, two ion implantations are carried out to form body regions 115 having the second doping type and source regions 116 having the first doping type.

In the step of the first ion implantation, a first mask is formed, for example, on the surface of the epitaxial layer 111. A patterned first mask is formed by photolithography, and then the first ion implantation is carried out via the patterned first mask. In the first ion implantation, a dopant of the second doping type is implanted to form the body regions 115 on two sides of the gate trench 112. By controlling parameters of the first ion implantation, for example, implantation energy and dose, the required depth and doping concentration can be achieved. Next, the second ion implantation is carried out to form the source regions 116 having the first doping type in the body regions 115. By controlling parameters of the secondary ion implantation, for example, implantation energy and dose, the required depth and doping concentration can be achieved.

Figure 2G:
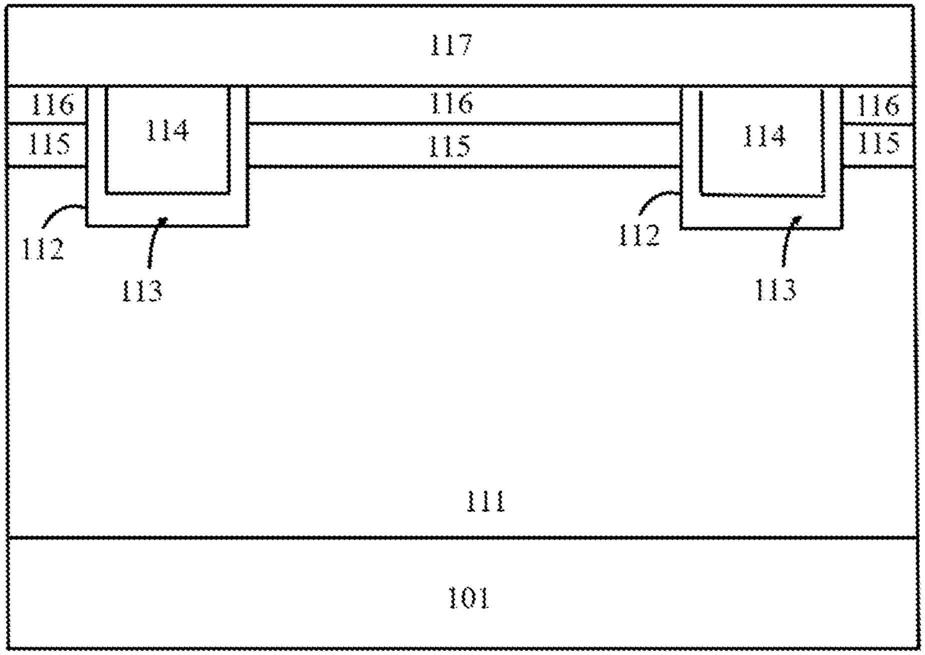

As shown in FIG. 2G, an interlayer dielectric layer 117 is formed.

The interlayer dielectric layer 117 is formed at atop of the epitaxial layer 111 by deposition, and chemical mechanical planarization is further carried out to obtain a flat surface. The interlayer dielectric layer 117 not only functions to isolate the gate conductor 114 from the source electrode, but also serves as a barrier layer during the subsequent process of forming an epitaxial depletion region by ion implantation, so the interlayer dielectric layer may have a larger thickness than that in a conventional process.

Figure 2H:
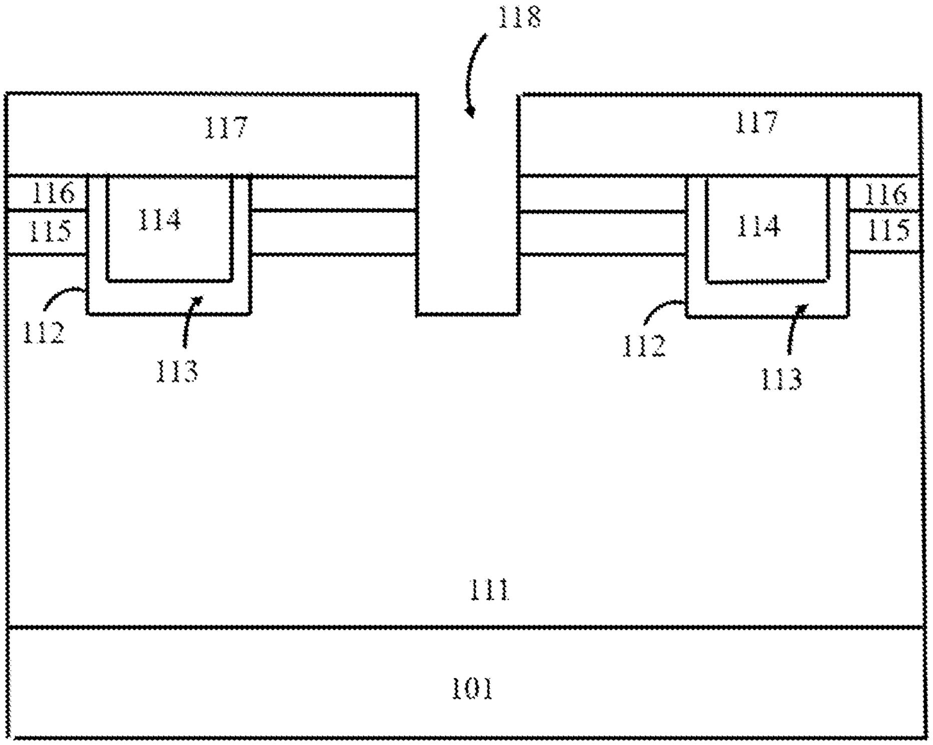

As shown in FIG. 2H, a first conductive channel 118 is formed.

For example, a mask is formed. A patterned mask is formed by photolithography, then the interlayer dielectric layer 117 between the two gate trenches 112 which is not covered by the mask is etched, and the source regions 116 and the body regions 115 are etched through so as to form the first conductive channel 118 in the epitaxial layer 111. The gate trenches 112 are symmetrically distributed with respect to the first conductive channel 118.

Figure 2I:
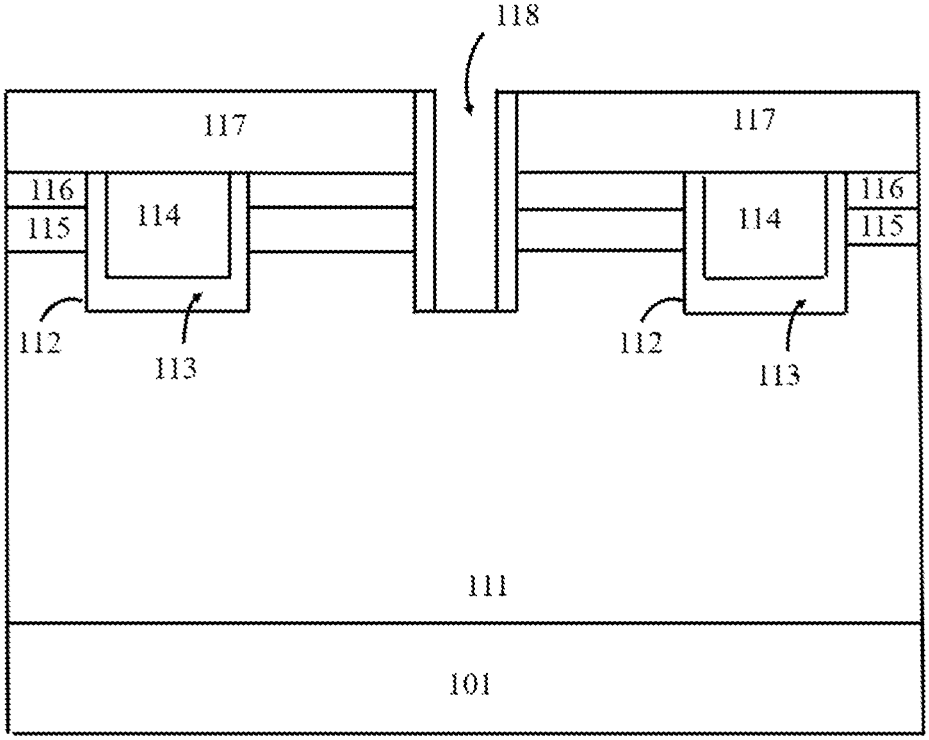

As shown in FIG. 2I, a barrier layer is formed on a side wall of the first conductive channel 118, thereby making preparations for the subsequent formation of the epitaxial depletion region by ion implantation.

Figure 2J:
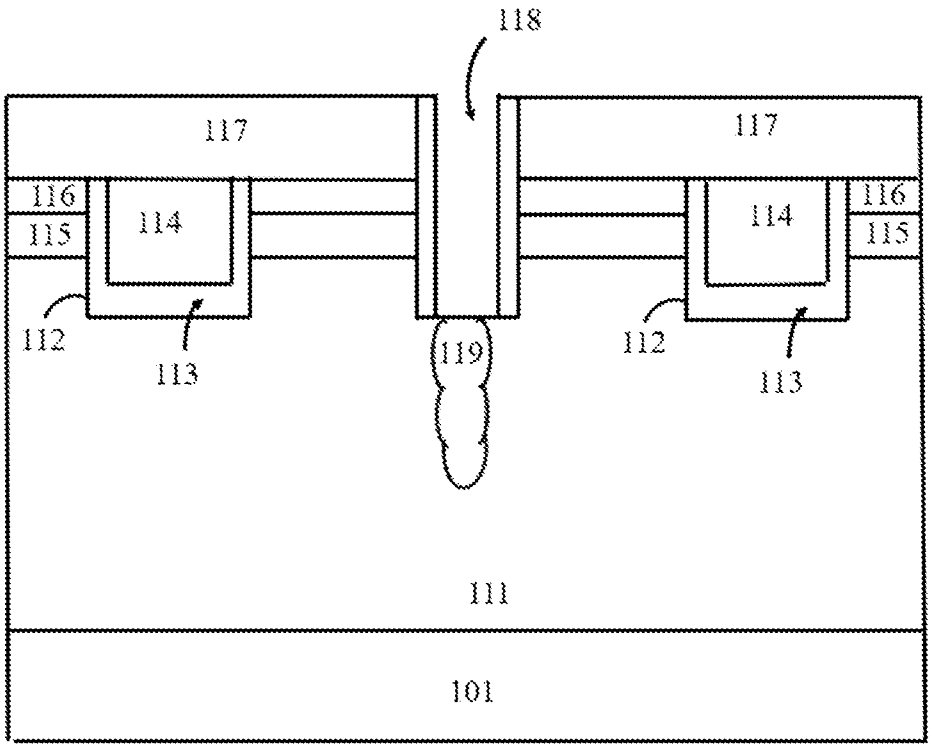

As shown in FIG. 2J, by using the interlayer dielectric layer 117 as the barrier layer, a dopant of the second doping type is implanted into the epitaxial layer at the bottom of the first conductive channel via the first conductive channel 118, for example, by P-type heavily doped ion implantation, to form an epitaxial depletion region 119 having the second doping type.

Figure 2K:
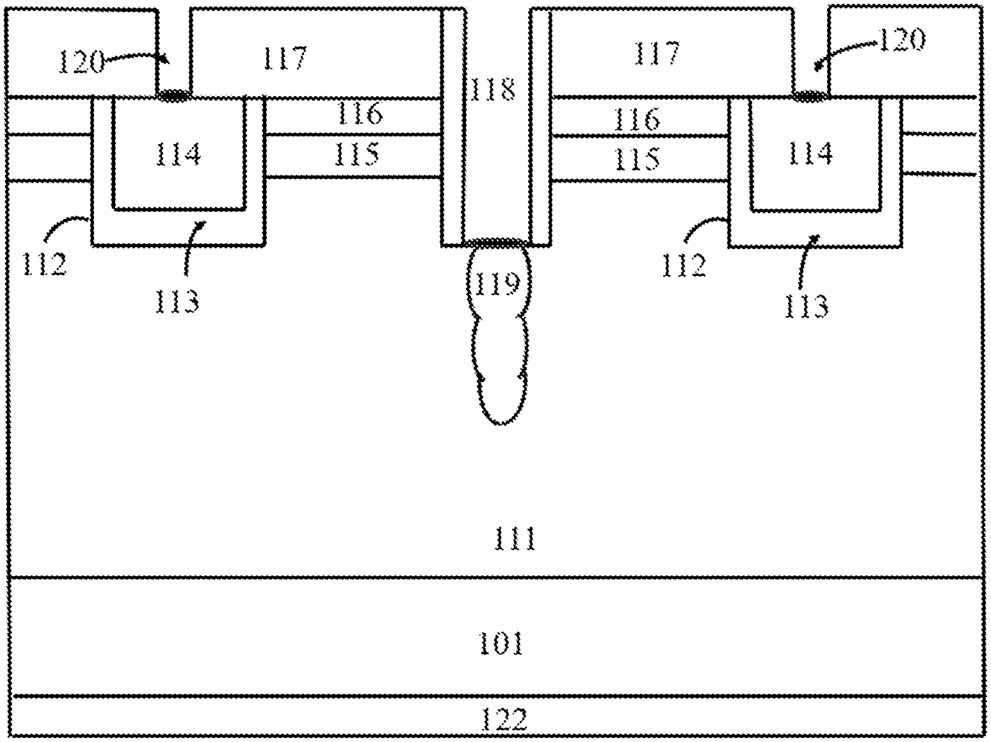

As shown in FIG. 2K, the interlayer dielectric layer 117 is etched to form second conductive channels 120. The source electrode formed subsequently contacts the gate conductor 114 via the second conductive channel 120. Next, the dopant of the second doping type is implanted to the bottoms of the first conductive channel 118 and the second conductive channels 120 to form contact doping regions. Then, titanium silicide is generated by a chemical reaction between titanium and a silicon material above the contact doping regions to serve as a glue layer.

Figure 2L:
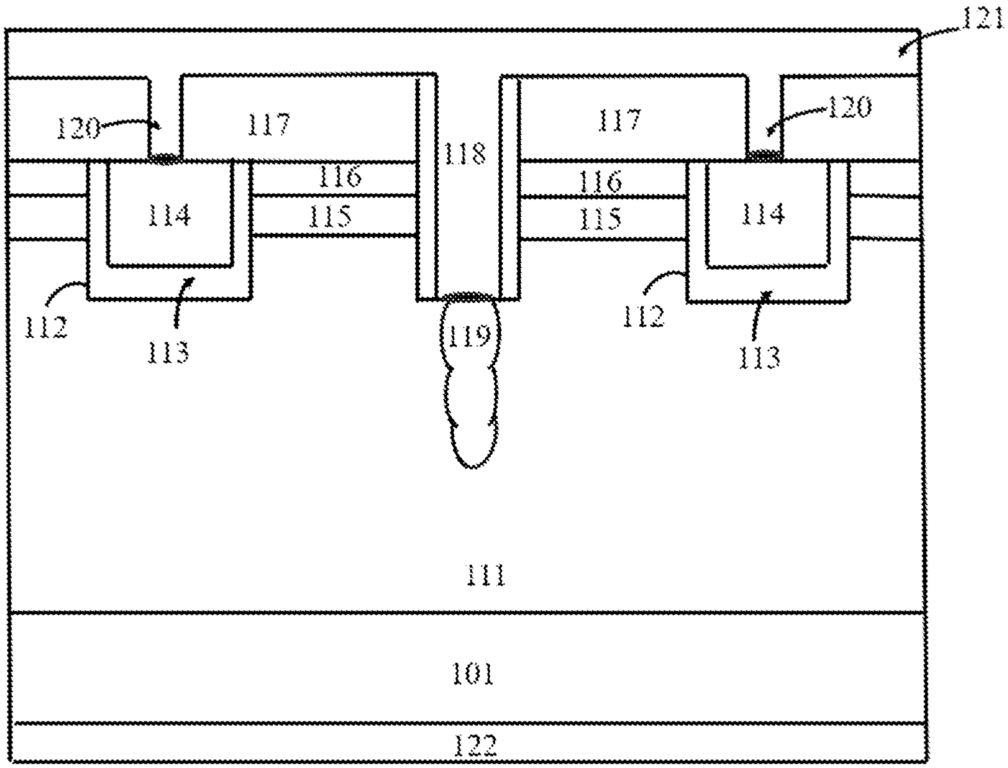

As shown in FIG. 2L, a source electrode 121 and a drain electrode 122 are formed.

The source electrode 121 is located on the epitaxial layer 111 and fills the first conductive channel 118 and the second conductive channels 120. The source electrode contacts the epitaxial depletion region 119 via the first conductive channel 118, and contacts the gate conductor 114 via the second conductive channel 120. The drain electrode 122 is formed on the surface of the substrate away from the surface of the epitaxial layer 111 and in contact with the substrate 101.

In one or more embodiments of the present disclosure, the source conductor, the source electrode, the gate conductor and the drain electrode 124 may be formed by varied conductive materials. In one or more embodiments, it may be a metal material such as aluminum alloy or copper.

The embodiments in accordance with the present disclosure, as described above, neither describe all details thoroughly nor limit the present disclosure, and are only the specific embodiments. Apparently, many modifications and variations are possible in light of the above description. These embodiments are selected and specifically described in this description to better explain the principle and practical application of the present disclosure, so that those skilled in the art may make good use of the present disclosure and modifications based on the present disclosure. The present disclosure is to be limited only by the claims and their full scope and equivalents.

What is claimed is:

1. A trench MOSFET, comprising:
- a substrate having a first doping type;
- an epitaxial layer having the first doping type, located on the substrate;
- gate trenches and a first conductive channel, extending from a surface to an inside of the epitaxial layer, the gate trenches being located on two sides of the first conductive channel and symmetrically distributed with respect to the first conductive channel;
- gate conductors, each located in one of the gate trenches and isolated from the epitaxial layer via a gate dielectric layer;
- an epitaxial depletion region having a second doping type, located in the epitaxial layer at a bottom of the first conductive channel and extending into a depth that is deeper than each of the gate trenches;
- body regions having the second doping type, located on two sides of each gate trench and adjacent to a side wall of the first conductive channel;
- source regions having the first doping type, each located on each of the body region;
- a source electrode, electrically connected to the epitaxial depletion region via the first conductive channel; and
- a drain electrode, in contact with the substrate on a surface of the substrate away from the epitaxial layer.

2. The trench MOSFET according to claim 1, wherein the epitaxial depletion region is formed by multiple ion implantations.

3. The trench MOSFET according to claim 1, further comprising second conductive channels, wherein the source electrode is electrically connected to the gate conductor via the second conductive channel.

4. The trench MOSFET according to claim 1, wherein a thickness of the gate dielectric layer at a bottom of the gate trenches is not smaller than a thickness of the gate dielectric layer on a side wall of the gate trenches.

5. The trench MOSFET according to claim 1, further comprising an interlayer dielectric layer; wherein the gate conductor is isolated from the source electrode via the interlayer dielectric layer.

6. A method for manufacturing a trench MOSFET, comprising:
- forming an epitaxial layer having a first doping type on a substrate having the first doping type;
- forming gate trenches extending from a surface to an inside of the epitaxial layer;
- forming a gate conductor and a gate dielectric layer inside each of the gate trenches, the gate conductor being isolated from the epitaxial layer via the gate dielectric layer;
- forming body regions having a second doping type, the body regions being located on two sides of each gate trench;
- forming source regions having the first doping type, each of the source regions being located in each of the body regions;
- forming a first conductive channel extending from the surface to the inside of the epitaxial layer between two of the gate trenches, the two gate trenches being symmetrically distributed with respect to the first conductive channel;

forming an epitaxial depletion region having the second doping type, the epitaxial depletion region being located in the epitaxial layer at a bottom of the first conductive channel and extending into a depth that is deeper than each of the gate trenches;

forming a source electrode, the source electrode electrically connected to the epitaxial depletion region via the first conductive channel; and forming a drain electrode, the drain electrode in contact with the substrate on a surface of the substrate away from the epitaxial layer.

7. The method according to claim 6, wherein the epitaxial depletion region having the second doping type is formed by carrying out multiple ion implantations to the epitaxial layer at the bottom of the first conductive channel via the first conductive channel.

8. The method according to claim 6, further comprising forming second conductive channels, wherein the source electrode is electrically connected to the gate conductor via the second conductive channel.

9. The method according to claim 6, wherein a thickness of the gate dielectric layer at a bottom of the gate trenches is not smaller than a thickness of the gate dielectric layer on a side wall of the gate trenches.

10. The method according to claim 6, further comprising: forming an interlayer dielectric layer, the gate conductor being isolated from the source electrode via the interlayer dielectric layer.

* * * * *